United States Patent
Le Craz

(10) Patent No.: US 12,000,050 B2
(45) Date of Patent: Jun. 4, 2024

(54) DIELECTRIC COATING

(71) Applicant: ArcelorMittal, Luxembourg (LU)

(72) Inventor: Sébastien Le Craz, Liège (BE)

(73) Assignee: ArcelorMittal, Luxembourg (LU)

( * ) Notice: Subject to any disclaimer, the term of this patent is extended or adjusted under 35 U.S.C. 154(b) by 0 days.

(21) Appl. No.: 17/910,867

(22) PCT Filed: Mar. 16, 2021

(86) PCT No.: PCT/IB2021/052174
§ 371 (c)(1),
(2) Date: Sep. 12, 2022

(87) PCT Pub. No.: WO2021/186341
PCT Pub. Date: Sep. 23, 2021

(65) Prior Publication Data
US 2023/0113179 A1    Apr. 13, 2023

(30) Foreign Application Priority Data
Mar. 18, 2020  (WO) .................. PCT/IB2020/052462

(51) Int. Cl.
*C23C 18/12* (2006.01)
*H01L 31/0224* (2006.01)
*H01L 31/0392* (2006.01)

(52) U.S. Cl.
CPC ........ *C23C 18/122* (2013.01); *C23C 18/1241* (2013.01); *C23C 18/1254* (2013.01); *C23C 18/127* (2013.01); *H01L 31/022425* (2013.01); *H01L 31/0392* (2013.01)

(58) Field of Classification Search
CPC .............. C23C 18/122; C23C 18/1241; C23C 18/1254; C23C 18/127; H01L 31/022425; H01L 31/0392

USPC .................................................... 106/287.16
See application file for complete search history.

(56) References Cited

U.S. PATENT DOCUMENTS

| | | | |
|---|---|---|---|
| 2009/0162560 A1 | 6/2009 | DeLuca et al. | |
| 2010/0089451 A1* | 4/2010 | Harimoto .............. | C23C 18/127 106/286.6 |
| 2015/0344671 A1 | 12/2015 | Furukawa et al. | |
| 2016/0115253 A1 | 4/2016 | Buskens et al. | |

FOREIGN PATENT DOCUMENTS

| | | |
|---|---|---|
| CN | 104981518 A | 10/2015 |
| CN | 105452393 A | 3/2016 |
| JP | 2000206305 A | 7/2000 |
| JP | 2001279178 A | 10/2001 |
| JP | 2005108691 A | 4/2005 |
| JP | 2009084454 A | 4/2009 |
| JP | 2012229432 A | 11/2012 |
| JP | 2013107926 A | 6/2013 |
| JP | 2018193455 A | 12/2018 |

OTHER PUBLICATIONS

Search Report of PCT/IB2021/052174 filed Sep. 6, 2021 and International Report on Patentability.

\* cited by examiner

*Primary Examiner* — James E McDonough
(74) *Attorney, Agent, or Firm* — Davidson Kappel LLC

(57) ABSTRACT

A sol composition for producing dielectric layers on a metallic substrate including 10 to 30%, by weight of the sol composition, of a precursor including a trialkoxysilane, 10 to 40%, by weight of the sol composition, of titanium dioxide particles whose median size is below 500 nm, 4.5 to 36%, by weight of the sol composition, of silica particles whose particle size distribution D90 is below 100 nm, 5 to 15%, by weight of the sol composition, of a solvent capable of making the precursor miscible in water, 0.1 to 2%, by weight of the sol composition, of an acidic catalyst, the remainder being water.

8 Claims, No Drawings

DIELECTRIC COATING

The present invention relates to a sol composition for producing a dielectric coating, in particular on a metallic substrate. The present invention also relates to the dielectric coating, to its use for manufacturing electronic devices, optoelectronic devices, and in particular solar cells. The present invention also relates to the methods thereof.

BACKGROUND

The solar cells are usually composed of several layers among which are included a substrate, a back-electrode, a p-n junction comprising an absorber layer and a front electrode.

SUMMARY OF THE INVENTION

When the substrate is metallic, it often has to be coated with a dielectric layer to isolate the solar cells from the conductive substrate. This dielectric layer must resist 250V without arc generation. It must also resist the thermal cycles performed during the manufacturing of the solar cells, typically an annealing at 550° C. to form the CIGS layer, without delaminating and without alteration of its properties.

Furthermore, as the layers to be applied on the dielectric layer are very thin (in the order of a micron), they can be continuous layers only if the dielectric layer is very smooth. Consequently, the roughness ($R_z$) of the dielectric layer has to be significantly lower than 1 µm.

The current solutions fulfilling the previous requirements and having the right roughness have a strained network which leads to cracks in the dielectric layer. Decreasing their internal stresses is done to the detriment of the roughness.

Therefore, there is a need for dielectric coatings having a good compromise between roughness, internal stresses and thermal stability.

For this purpose, a first subject of the present invention consists of a sol composition for producing dielectric layers on a metallic substrate comprising:
- 10 to 30%, by weight of the sol composition, of a precursor comprising a trialkoxysilane,
- 10 to 40%, by weight of the sol composition, of titanium dioxide particles whose median size is below 500 nm,
- 4.5 to 36%, by weight of the sol composition, of silica particles whose particle size distribution D90 is below 100 nm,
- 5 to 15%, by weight of the sol composition, of a solvent capable of making the precursor miscible in water,
- 0.1 to 2%, by weight of the sol composition, of an acidic catalyst, the remainder being water.

The sol composition according to the invention may comprise:
- 10 to 30%, by weight of the sol composition, of a precursor comprising a trialkoxysilane,
- 10 to 40%, by weight of the sol composition, of titanium dioxide particles whose median size is below 500 nm,
- 30 to 60%, by weight of the sol composition, of a water dispersion of silica comprising 15 to 60%, by weight of water dispersion, of silica particles whose particle size distribution D90 is below 100 nm,
- 5 to 15%, by weight of the sol composition, of a solvent capable of making the precursor miscible in water,
- 0.1 to 2%, by weight of the sol composition, of an acidic catalyst.

The sol composition according to the invention may also have the optional features listed below, considered individually or in combination:
- the trialkoxysilane is an organofunctional trialkoxysilane of general formula R'—Si(OR)$_3$ where R' represents an organofunctional group and R represents an alkyl,
- the trialkoxysilane is an alkyl trialkoxysilane,
- the trialkoxysilane is chosen among methyltrialkoxysilanes, ethyltrialkoxysilanes and propyltrialkoxysilanes,
- the trialkoxysilane is the methyltrimethoxysilane,
- the precursor is a mixture of at least one tetraalkoxysilane and at least one trialkoxysilane,
- the content in precursor is comprised between 15 to 25% by weight of the sol composition,
- the solvent is chosen among alcohols, ketones and mixtures thereof,
- the solvent is acetone,
- the size of the titanium dioxide particles is comprised between 200 and 1000 nm,
- the titanium dioxide particles are coated with 2 to 6% of alumina by weight of $TiO_2$ particles,
- the content of the water dispersion of silica is comprised between 35 and 55%, by weight of the sol composition, and the water dispersion of silica comprises 40 to 55%, by weight of water dispersion, of silica particles,
- the water dispersion of silica comprises a mix of silica particles of two different size ranges: a first range between 50 and 120 nm and a second range between 3 and 25 nm,
- the acidic catalyst comprises phosphoric acid, A second subject of the invention consists of a metallic substrate coated on at least part of at least one of its surfaces with at least 10 µm of a dielectric layer comprising:
- 20 to 70%, by weight of the dielectric layer, of titanium dioxide particles whose median size is below 500 nm,
- 20 to 70%, by weight of the dielectric layer, of silica particles whose particle size distribution D90 is below 100 nm,
- 5 to 18%, by weight of the dielectric layer, of a polymerized trialkoxysilane precursor,
- 0.1 to 2%, by weight of the dielectric layer, of an acidic catalyst.

A third subject of the invention consists of a process for producing a sol composition comprising the steps of:
Supplying:
- 10 to 30 parts by weight of a precursor comprising a trialkoxysilane,
- 10 to 40 parts by weight of titanium dioxide particles whose median size is below 500 nm,
- 30 to 60 parts by weight of a water dispersion of silica comprising to 60%, by weight of water dispersion, of silica particles whose particle size distribution D90 is below 100 nm,
- 5 to 15 parts by weight of a solvent capable of making the precursor miscible in water,
- 0.1 to 2 parts by weight of an acidic catalyst.

Mixing the components.

A fourth subject of the invention consists of a sol-gel process for producing dielectric layers on a metallic substrate comprising the steps of:
(i) supplying the metallic substrate and a sol composition comprising:
- 10 to 30%, by weight of the sol composition, of a precursor comprising a trialkoxysilane,
- 10 to 40%, by weight of the sol composition, of titanium dioxide particles whose median size is below 500 nm,
- 30 to 60%, by weight of the sol composition, of a water dispersion of silica comprising 15 to 60%, by weight of water dispersion, of silica particles whose particle size distribution D90 is below 100 nm,
- 5 to 15%, by weight of the sol composition, of a solvent capable of making the precursor miscible in water,
- 0.1 to 2%, by weight of the sol composition, of an acidic catalyst, (ii) depositing the sol composition on at least one surface of the metallic substrate,
(iii) evaporating the solvent to form a dielectric layer.

The sol-gel process according to the invention may also have the optional features listed below, considered individually or in combination:
- at least 20 µm of sol composition is deposited,
- step (iii) consists in a drying step whose peak metal temperature of the metallic substrate is comprised between 120 and 200° C. and whose drying time is comprised between 30 s and 4 min,
- The process further comprises the step (iv) of annealing the dielectric layer during 30 s to 4 min with a peak metal temperature of the metallic substrate comprised between 300 and 600° C.

A fifth subject of the invention consists of a process for manufacturing solar cells, comprising:
- (i) supplying a metallic substrate coated on at least part of at least one of its surfaces with at least 10 µm of a dielectric layer comprising:
  - 20 to 70%, by weight of the dielectric layer, of titanium dioxide particles whose median size is below 500 nm,
  - 20 to 70%, by weight of the dielectric layer, of silica particles whose particle size distribution D90 is below 100 nm,
  - 5 to 18%, by weight of the dielectric layer, of a polymerized trialkoxysilane precursor,
  - 0.1 to 2%, by weight of the dielectric layer, of an acidic catalyst.
- (ii) depositing a molybdenum-based back electrode onto the dielectric layer.

DETAILED DESCRIPTION

The invention will be better understood by reading the following description, which is provided purely for purposes of explanation and is in no way intended to be restrictive.

It should be noted that, as used herein, the terms "over" and "on" both inclusively include "directly on" (no intermediate materials, elements or space disposed therebetween) and "indirectly on" (intermediate materials, elements or space disposed therebetween). For example, forming an element "on a substrate" can include forming the element directly on the substrate with no intermediate materials/elements therebetween, as well as forming the element indirectly on the substrate with one or more intermediate materials/elements therebetween.

By metallic substrate, it is meant an element that has a flat shape, i.e., its thickness is low compared to its other dimensions. Generally speaking, its thickness may be 500 to 4000 times lower than its width. The substrate may be made of a single material or a composite assembly. Carbon steel, stainless steel, aluminum, copper and zinc may be cited as non-restricting examples of metallic materials. Carbon steels and stainless steels are preferred. The metallic substrate can be in the form of a coil or a sheet.

The dielectric coating of the invention is obtained thanks to a sol composition. The sol-gel process is a method for producing solid materials from small molecules. The method is used for the fabrication of metal oxides, especially the oxides of silicon (Si) and titanium (Ti). The process involves conversion of monomers into a colloidal solution (sol) that acts as the precursor for an integrated network (or gel) of either discrete particles or network polymers. Typical precursors are metal alkoxides.

The sol composition according to the invention first comprises a precursor comprising a trialkoxysilane, preferably a non-hydrogenated trialkoxysilane.

The precursor can be notably an organofunctional trialkoxysilane of general formula R'—Si(OR)$_3$ where R' represents an organofunctional group and R represents an alkyl.

The organofunctional trialkoxysilane can be notably chosen from methyltrimethoxysilane, methyltriethoxysilane, methyltripropoxysilane, methyltributoxysilane, ethyltrimethoxysilane, ethyltriethoxysilane, ethyltripropoxysilane, ethyltributoxysilane, propyltrimethoxysilane, propyltriethoxysilane, propyltripropoxysilane, propyltributoxysilane (3-glycidyloxypropyl)trimethoxysilane, (dibutyl-oxyaluminooxy)triethoxysilane, 3-aminopropyltriethoxysilane, 3-isocyanatopropyltriethoxysilane, 3-mercaptopropyltriethoxysilane, aminophenyltriethoxysilane, tridecafluoro 1,1,2,2-tetrahydrooctyl triethoxysilane, chloropropyltriethoxysilane, amyltriethoxysilane, vinyltriethoxysilane or phenyltriethoxysilane or a mixture thereof.

The trialkoxysilane is preferably an alkyl trialkoxysilane, more preferably chosen from methyltrialkoxysilanes, ethyltrialkoxysilanes or propyltrialkoxysilanes. The trialkoxysilane is more preferably selected among methyltrimethoxysilane, methyltriethoxysilane, methyltripropoxysilane, ethyltrimethoxysilane, ethyltriethoxysilane, ethyltripropoxysilane, propyltrimethoxysilane, propyltriethoxysilane or propyltripropoxysilane. These trialkoxysilanes further improve the thermal resistance of the dielectric coating.

Thanks to the trialkoxy function, the network obtained with the precursor is a trivalent network with, preferably, organofunctional groups interspersed. It is less strained than a silica network and thus cracks are limited. The flexibility of the network can be adjusted case by case by the choice of the organofunctional group.

The effect of these groups is such that the precursor can also be a mixture of at least one tetraalkoxysilane and at least one trialkoxysilane. In particular, it can be the combination of tetramethoxysilane, tetraethoxysilane, tetrapropoxysilane or tetrabutoxysilane with methyltrimethoxysilane, methyltriethoxysilane, methyltripropoxysilane, methyltributoxysilane, ethyltrimethoxysilane, ethyltriethoxysilane, ethyltripropoxysilane or ethyltributoxysilane. In that case, the tetrahedral network of the first precursor is balanced with the trivalent network of the second precursor, which limits the stresses in the network.

The precursor is in particular the organosilicon compound methyltrimethoxysilane (MTMOS) with the formula CH$_3$Si (OCH$_3$)$_3$. Films formed from this precursor are very resistant to temperature. Under inert gas, it starts slowly degrading around 500-600° C.

Methyltrimethoxysilane easily hydrolyzes and its condensation is easily manageable in acidic conditions. Consequently, it shelf time is at least 24 h, which allows some flexibility in the process of manufacturing the dielectric coating. The polymerization steps of this precursor are the following:

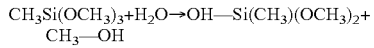

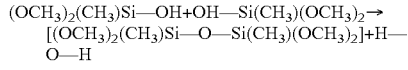

Or

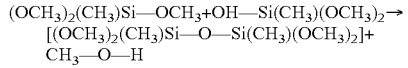

Thus, polymerization is associated with the formation of a 3-dimensional network of siloxane [Si—O—Si] bonds accompanied by the production of H—O—H and R—O—H species.

The content in precursor is comprised between 10 and 30 wt % of the sol composition. It has been observed that below 10 wt %, the content is not enough to obtain a good cohesion of the coating. Above 30 wt %, microcracks tend to appear which affects the electrical insulation. Preferably, it is comprised between 15 and wt % which gives the best compromise between internal stresses and thermal stability.

In the sol composition, the precursor might be in the hydrolyzed form. The content ranges given in the description do not take into account this hydrolysis. In particular, the content range in precursor is the content range of the non-hydrolyzed precursor. For a given sol composition, the content range of the hydrolyzed precursor can be easily calculated.

The sol composition further comprises a solvent capable of making the precursor miscible in water so that the hydrolysis to take place is homogeneous.

The solvent can be selected among alcohols, ketones and mixtures thereof. The alcohol is preferably selected among monohydric alcohols which present the best compromise between water solubility and boiling point. Possible monohydric alcohols are ethanol, butanol, isopropanol, methoxypropanol and mixtures thereof. The ketone is preferably selected among acetone and methylethylketone. Acetone is preferred as it favors the dispersion of particles, it is 100% miscible with water. It also evaporates at low temperature (56° C.) but not too low so that, if the sol composition is sprayed on the substrate, it doesn't evaporate in the spray mist.

With mixtures of solvents, the wettability of the sol composition on the metallic substrate can be favored and the evaporation is better controlled.

The content in solvent(s) is comprised between 5 and 50% by weight of the sol composition. Below 5 wt %, the composition is too viscous. Above 50 wt %, the dilution is too important and thick layers with a good electrical insulation cannot be obtained. Preferably, it is comprised between 5 and 15 wt % which represents the best compromise between viscosity and dilution.

The sol composition further comprises 10 to 40% by weight of the sol composition of titanium dioxide particles whose median size is below 500 nm. $TiO_2$ is very stable, resists to high temperature and easily disperses in water. Preferably, the content in titanium dioxide particles is comprised between 20 and wt %.

Thanks to the median size of the particles, large particles protruding at the surface of the dielectric coating are prevented, keeping the roughness at a low level. More preferably the particle size is comprised between 200 and 1000 nm.

Preferably, the surface of the $TiO_2$ particles is coated to stop the $TiO_2$ from being photoactive, which might otherwise deteriorate the dielectric coating and the corresponding solar cells in the long run. The surface coating can be alumina or silica. Alumina is preferred as it is thought to help the dielectric layer maintaining its integrity during thermal expansion. When $TiO_2$ is coated with alumina, it typically comprises 2-6% of alumina by weight of alumina-coated $TiO_2$ particles.

The $TiO_2$ particles are preferably not functionalized in surface with hydroxyl groups, hydrogen polysiloxane or dihydrogen polysiloxane.

As $TiO_2$ cannot bring enough cohesivity to the dielectric coating by itself, the sol composition further comprises 4.5 to 36%, by weight of the sol composition, of silica particles whose particle size distribution D90 is below 100 nm. Silica is also an electrical insulator, chemically inert and resistant to high temperatures.

The sol composition preferably comprises 14 to 30%, by weight of water dispersion, of silica particles.

As the silica particles are significantly smaller and less dense that the $TiO_2$ particles, the surface of the dielectric coating is mainly composed of silica, which lower the roughness of the coating. The silica particles have preferably a size comprised between 3 and 120 nm.

The silica particles are preferably not functionalized in surface with hydroxyl groups, hydrogen polysiloxane or dihydrogen polysiloxane.

Optionally, the sol composition comprises a mix of silica particles of two different size ranges: a first range between 50 and 120 nm and a second range between 3 and 25 nm. In that case, the particles of the second particle size distribution can represent up to 30 wt % of the total weight in silica particles and preferably between 10 and 30 wt %. This further improves the roughness of the dielectric coating.

According to a preferred embodiment, the silica is added to the sol composition in the form of a water dispersion of silica. In that case, 4.5 to 36%, by weight of the sol composition, of silica particles along with the water added as remainder of the sol composition corresponds to 30 to 60%, by weight of the sol composition, of a water dispersion of silica comprising 15 to 60%, by weight of water dispersion, of silica particles. The aqueous dispersion of silica is a source of pure silica which is an electrical insulator, chemically inert and resistant to high temperatures. It is also a source of water for the hydrolysis of the sol-gel precursor.

The sol composition preferably comprises 35 to 55%, by weight of the sol composition, of a water dispersion of silica comprising 40 to 55% by weight of water dispersion, of silica particles. Thanks to this concentration, the gel obtained by polymerization of the sol composition is more easily dried and the dielectric coating drier, which prevents it from cracking. Thanks to the presence of water in that proportion, the hydrolysis of the precursor is done in good conditions.

According to one variant, before mixing the components of the sol composition, the pH of the water dispersion of silica is maintained between 9 and to limit the occurrence of silicate. The pH can be controlled by the addition of a base in the solution, such as sodium hydroxide, sodium oxide, ammonium hydroxide or ammonium oxide.

According to another variant, silica is dispersed in deionised water at pH comprised between 4 and 5.

The sol composition further comprises 0.1 to 2% by weight of the sol composition of an acidic catalyst, preferably between 0.2 and 0.8%. Thanks to its acidic nature, a dense coating can be obtained. This catalyst also controls the polymerization speed. The catalyst will thus be selected based on the required speed in accordance with the application process. If a fast polymerization speed is preferred, strong acids such as hydrochloric acid or sulfuric acids will be considered. If the shelf time of the sol composition has to be extended to one day or two so that the composition can be prepared ahead of its application and stored in the meantime, weak acids are preferred. Weak acids can be selected among phosphoric acid, phosphorous acid, formic acid, acetic acid, lactic acid, oxalic acid, citric acid, tartaric acid, benzoic acid. Inorganic acids are preferred for their thermal stability so that the coating network do not get polluted with carbon residues. Phosphoric acid, whose trivalent nature makes it very rigid, is particularly preferred.

The sol composition further comprises water as a remainder. By the expression "the remainder being water", it is meant that there is water left in the sol composition even after hydrolysis of the precursor. Thanks to the presence of water, the hydrolysis of the precursor is done in good conditions, the particles of silica and $TiO_2$ are well stabilized and dispersed and the evaporation of the solvent is better controlled. It is preferably deionised water.

When silica is added in the form of a water dispersion, water is preferably provided only through the water dispersion.

Thanks to this sol composition, it is possible to obtain on a metallic substrate dielectric layers thicker than 20 μm with a very low roughness ($R_a$ below 100 nm and $R_z$ between 200 and 600 nanometers) without pinholes. These layers can be heated up to 600° C. for hours without cracks during heating and cooling down. Furthermore, these layers are efficient barriers against the diffusion of iron from the steel substrate, which eliminates the need of a barrier layer between the steel substrate and the PV cells.

The sol composition is prepared by mixing the different components all together.

Alternatively, the sol composition is a bi-component product. In that case, a first component is preferably prepared by mixing the titanium dioxide particles, the water dispersion of silica and the solvent. A second component is preferably prepared by mixing the precursor and the acidic catalyst. The 2 components are then mixed together before using the sol composition.

Optionally, the sol composition is finally filtered at 1 μm to remove possible agglomerates.

In term of process, once a metallic substrate and the sol composition have been supplied, the composition, is deposited on at least part of at least one surface of a substrate. It can be done for example by dip-coating, spin coating, roll-coating, slot-die coating, spraying, inkjet printing. Slot-die is preferred for the surface homogeneity it provides.

The sol composition is preferably applied in a quantity sufficient to obtain a dried dielectric layer at least 10 μm thick. Below, the coating might not be dielectric enough. The applied wet sol composition is at least 20 μm thick.

In the next step, the sol evolves gradually towards the formation of a gel-like network containing both a liquid phase and a solid phase. The simplest method is to allow time for sedimentation and evaporation of the solvent to occur, thus obtaining the dielectric layer. Preferably, evaporation of water also occurs. Preferably a drying step is performed to rapidly dry the applied film and obtain the dielectric layer. The drying can be done in an oven, in a continuous process or batch process, by convection, induction, infrared or any other suitable method. More preferably, the peak metal temperature of the metallic substrate covered with the film is comprised between 120 and 200° C. and the drying time is comprised between 30 s and 4 min.

Optionally, for optimal dielectric performances, the dielectric layer is further annealed under inert gas to fully remove from the layer any water trapped in the coating. Such annealing prevents the water from degassing during the subsequent steps of the process for manufacturing solar cells and thus from deteriorating the subsequent layers. The annealing can be done in an oven, in a continuous process or batch process, by convection, induction or any other suitable method. More preferably, the peak metal temperature of the metallic substrate covered with the dielectric layer is comprised between 300 and 600° C., more preferably between 500 and 600° C., even more preferably between 540 and 560° C., and the drying time is comprised between 30 s and 4 min.

The sol-gel coating comprises 20-70 wt % of silica particles, 20-70 wt % of titanium dioxide particles, the remaining part of the coating comprising the polymerized precursor, i.e. a tridimensional network of siloxane (Si—O—Si) bonds, preferably comprising Si atoms linked to organofunctional groups, and the acidic catalyst. In particular, the sol-gel coating comprises 5 to 18%, by weight of the dielectric layer, of the network and 0.1 to 2%, by weight of the dielectric layer, of the acidic catalyst. The sum of the contents of the different elements is equal to 100%.

The characteristics of the sol-gel coating can be obtained by SEM (for the particles sizes and nature), by X-ray fluorescence (for Si and Ti contents) and by IR spectroscopy (for $SiO_2$ and network contents).

The obtained sol-gel coating is at least 10 μm thick to have good dielectric properties. It has a roughness $R_a$ below 100 nm and a roughness $R_z$ below 600 nm. It has an adhesion to the metallic substrate of at least 3 as measured by tape test according to ASTM D3359. Its electrical insulation is such that the resistance measured with a gigahommeter between the metallic substrate and a drop of saturated salted water deposited on the surface of the sol-gel coating is of at least 272 Gigaohms under 250V for at least 3 min. Its breakdown voltage is of at least 1000V.

Once the sol composition has been applied on the substrate, dried and optionally heat treated, the different layers composing the solar cells can be deposited.

According to one variant of the invention, the solar cells are CIGS solar cells. CIGS refers here to a group of materials that have desirable properties for use as the absorber layer in thin-film solar cells. Copper indium diselenide ($CuInSe_2$ or CIS) and its higher band gap variants copper indium gallium diselenide ($Cu(In/Ga)Se_2$ or CIGS), copper indium aluminum diselenide ($Cu(In/Al)Se_2$), copper indium gallium aluminum diselenide ($Cu(In/Ga/Al)Se_2$) and any of these compounds with sulfur replacing some of the selenium are members of this group.

CIGS thin-film solar cells are normally produced by first depositing a molybdenum-based back electrode onto a substrate such as glass, stainless steel foil, carbon steel foil, or other functional substrate material. It can be done by RF or DC magnetron sputtering. The molybdenum-based back electrode can be made of a layer of molybdenum (Mo) or of molybdenum-sodium (Mo/Na) or of molybdenum-potassium (Mo/K) or made of a plurality of sublayers of Mo and/or Mo/Na and/or Mo/K. Alternatively, a zirconium nitride barrier layer can be added above the back electrode so that diffusion is blocked, thus allowing replacing molybdenum by other metals such as silver, aluminum, copper.

A relatively thick layer of CIGS is then deposited on the molybdenum layer by known techniques. In the precursor technique, the metals (Cu/In/Ga) are first deposited onto the substrate using a physical vapor deposition (PVD) process (i.e. evaporation or sputtering), chemical bath, or electroplating process. Subsequently, a selenium bearing gas is reacted with the metals layer in a diffusion furnace at temperatures ranging up to about 600° C. to form the final CIGS composition. The most commonly used selenium bearing gas is hydrogen selenide, which is extremely toxic to humans and requires great care in its use. A second technique avoids the use of hydrogen selenide gas by co-evaporating all of the CIGS constituents onto a hot substrate from separate thermal evaporation sources. In a third technique, the CIGS layer is deposited by DC magnetron sputtering with planar and/or rotative magnetrons.

The CIGS layer can be made of a plurality of sublayers. In certain embodiments, each sublayer has the same composition. In other embodiments, the compositions of the sublayers differ such that the CIGS layer has a composition that is graded in at least one elemental concentration from at least one sublayer to another sublayer. In some embodiments, each sublayer has the same thickness, while in other embodiments, at least two sublayers have different thicknesses.

The n-type material most often used with CIGS absorbers to form the thin "window" or "buffer" layer is cadmium sulfide (CdS). It is much thinner than the CIGS layer and can be applied by chemical bath deposition (CBD) or by DC sputtering. Because of the toxicity and waste disposal problems associated with cadmium, ZnS can be used as a substitute. It can be made by AC reactive sputtering from elemental zinc targets and injection of hydrogen sulfide.

Finally, the window or buffer layer is covered with a relatively thick transparent electrically conducting oxide, which is also an n-type semiconductor. In the past zinc oxide (ZnO) has been used as an alternative to the traditional, but more expensive, indium tin oxide (ITO). Recently, aluminum-doped ZnO (AZO) has been shown to perform about as well as ITO, and it has become the material of choice in the industry. It can be made by magnetron sputtering.

Optionally, additional conductive layers such as top metallization layer or a passivation layer may be deposited over the buffer layer. Patterning and interconnect steps may also be performed to provide a monolithically integrated device.

Alternatively, the dielectric coating obtained from the sol composition can be used for the manufacture of other electronic devices or optoelectronic devices such as phototransistors, photomultipliers, light-emitting diodes (LED).

A first sol composition was prepared by mixing:
On one hand, 40 g of titanium dioxide particles coated with 4 wt % alumina (Ti-Pure™ R900 supplied by Chemours™ (DuPont™) with a median particle size of 410 nm), 70 g of a water dispersion of silica comprising 50 wt % of silica with a particle size distribution D90 below 100 nm (Levasil CT3PL supplied by Nouryon®) and 15 g of acetone,
One the other hand, 30 g of trimethoxymethylsilane and 0.5 mL of phosphoric acid as an 85% aqueous solution.
The two components were then mixed together.

A second sol composition was prepared by mixing:
On one hand, 40 g of titanium dioxide particles coated with 4 wt % alumina (Ti-Pure™ R900 supplied by Chemours™ (DuPont™) with a median particle size of 410 nm), 60 g of a water dispersion of silica comprising 50 wt % of silica with a particle size distribution D90 below 100 nm (Levasil CT3PL supplied by Nouryon®) and 25 g of technical ethanol,
One the other hand, 30 g of trimethoxymethylsilane and 0.5 mL of phosphoric acid as an 85% aqueous solution.
The two components were then mixed together with 25 g of a water dispersion of silica comprising 50 wt % of silica with a substantially monodisperse (d=22 nm) particle diameter distribution (Ludox® TM-50 supplied by Sigma Aldrich).

A third sol composition was prepared by mixing:
On one hand, 36 g of talc/mica particles (Plastorit® Super supplied by Ymeris Performances Additives with a particle size D50 of 3.7 μm), 70 g of a water dispersion of silica comprising 50 wt % of silica with a particle size distribution D90 below 100 nm (Levasil CT3PL supplied by Nouryon®) and 10 g of acetone,
One the other hand, 25 g of trimethoxymethylsilane and 1 mL of phosphoric acid as an 85% aqueous solution.
The two components were then mixed together.

A fourth sol composition was prepared by mixing:
On one hand, 40 g of titanium dioxide particles coated with 4 wt % alumina (Ti-Pure™ R900 supplied by Chemours™ (DuPont™) with a median particle size of 410 nm), 70 g of a water dispersion of silica comprising 50 wt % of silica with a particle size distribution D90 below 100 nm (Levasil CT3PL supplied by Nouryon®) and 15 g of acetone,
One the other hand, 60 g of trimethoxymethylsilane and 0.5 mL of phosphoric acid as an 85% aqueous solution.
The two components were then mixed together.

A fifth sol composition was prepared by mixing:
On one hand, 40 g of titanium dioxide particles coated with 4 wt % alumina (Ti-Pure™ R900 supplied by Chemours™ (DuPont™) with a median particle size of 410 nm), 70 g of a water dispersion of silica comprising 50 wt % of silica with a particle size distribution D90 below 100 nm (Levasil CT3PL supplied by Nouryon®) and 15 g of acetone,
One the other hand, 30 g of trimethoxymethylsilane and 1 mL of ammonia at 30% (basic catalyst).
The two components were then mixed together.

The contents of each element are summarized in Table 1 for both the sol compositions (wet wt %) and the dielectric layer obtained with the sol compositions (dry wt %).

All compositions, except the fifth one, were applied with a wet thickness of about 50 μm on a steel substrate by slot-die coating. They were dried during 1 min with a peak metal temperature of 170° C. They were then annealed during 10 min with a peak metal temperature of 550° C. The fifth sol composition demixed and precipitated because of the presence of the basic catalyst and could not be applied on a steel substrate.

The results obtained with the first four dielectric coatings obtained from the first four sol compositions, are detailed in Table 2.

The roughness was measured according to standard ISO1997 (0.5 mm/s, λc=0.8, run=0.5 cm).

The dielectric performances were assessed by applying 250V on the dielectric coating with a droplet of saturated salted water (around 1 cm wide) as a contact between the dielectric coating and a top electrode of a gigahommeter and, a bottom electrode of the gigahommeter being linked to the steel substrate. The resistance must stay above 272 GigaOhms during 3 mins.

The breakdown voltage was measured by applying a voltage between the top electrode of a gigahommeter in contact with the dielectric layer with a droplet of saturated salted water (around 1 cm wide) and the bottom electrode of the gigahommeter linked to the steel substrate. The breakdown voltage must be of at least 1000V.

The adhesion of the dielectric coating on the metallic substrate was measured by tape test according to ASTM D3359.

As it is apparent from the results, the sol compositions according to the invention have a good compromise between roughness, internal stresses (assessed through the resistance test), dielectric performances and thermal stability (assessed during the annealing). On the other hand:
Sol compositions with other particles than titanium dioxide particles whose median size is below 500 nm fail to reach the roughness compatible with electronic applications (sol composition 3),
Sol compositions with a level in precursor higher than 30% fail to reach the correct electrical insulation due to micro-cracks and porosity (sol composition 4),
Sol compositions with a basic catalyst are unstable and demix.

TABLE 1

|  | Sol composition 1* | | Sol composition 2* | | Sol composition 3 | | Sol composition 4 | | Sol composition 5 | |
| --- | --- | --- | --- | --- | --- | --- | --- | --- | --- | --- |
|  | Wet wt % | Dry wt % | Wet wt % | Dry wt % | Wet wt % | Dry wt % | Wet wt % | Dry wt % | Wet wt % | Dry wt % |
| Precursor | 19 | 10.5 | 16.5 | 9.6 | 17.6 | 9.3 | 32.3 | 19 | 19.2 | 10.4 |
| TiO2 | 26 | 47 | 22 | 43.5 | 0 | 0 | 21.5 | 43.0 | 25.5 | 47.0 |
| Talc/Mica | 0 | 0 | 0 | 0 | 25.4 | 45.5 | 0 | 0 | 0 | 0 |
| Silica dispersion silica | 22.5 | 41.5 | 23.5 | 46.2 | 24.65 | 44.2 | 18.85 | 37.6 | 22.35 | 41.2 |
| water | 22.5 | 0 | 23.5 | 0 | 24.65 | 0 | 18.85 | 0 | 22.35 | 0 |

TABLE 1-continued

|  | Sol composition 1* | | Sol composition 2* | | Sol composition 3 | | Sol composition 4 | | Sol composition 5 | |
| --- | --- | --- | --- | --- | --- | --- | --- | --- | --- | --- |
|  | Wet wt % | Dry wt % | Wet wt % | Dry wt % | Wet wt % | Dry wt % | Wet wt % | Dry wt % | Wet wt % | Dry wt % |
| Solvent | 9.5 | 0 | 14 | 0 | 7.0 | 0 | 8.1 | 0 | 9.6 | 0 |
| Acid catalyst | 0.5 | 1 | 0.5 | 0.8 | 0.7 | 1 | 0.4 | 0.4 | 0 | 0 |
| Basic catalyst | 0 | 0 | 0 | 0 | 0 | 0 | 0 | 0 | 1.0 | 1.4 |

*According to the invention

TABLE 2

|  | $R_a$ (nm) | $R_z$ (nm) | Resistance (GigaOhms) | Breakdown voltage (V) | Adhesion |
| --- | --- | --- | --- | --- | --- |
| Dielectric coating 1 | 70-80 | 450-550 | >272 | 1800 | 3 |
| Dielectric coating 2 | 50-60 | 250-350 | >272 | 1100 | 3 |
| Dielectric coating 3 | 200-500 | 2000-3000 | Failed | N/A | N/A |
| Dielectric coating 4 | 60-80 | 350-500 | Failed | N/A | N/A |

N/A: not available

What is claimed is:

1. A sol composition for producing dielectric layers on a metallic substrate comprising:
   to 30%, by weight of the sol composition, of a precursor including a trialkoxysilane;
   to 40%, by weight of the sol composition, of titanium dioxide particles whose median size is below 500 nm;
   4.5 to 36%, by weight of the sol composition, of silica particles whose particle size distribution D90 is below 100 nm;
   to 15%, by weight of the sol composition, of a solvent capable of making the precursor miscible in water; and
   to 2%, by weight of the sol composition, of an acidic catalyst;
   a remainder being water.

2. The sol composition as recited in claim 1 wherein the trialkoxysilane is chosen from the group consisting of methyltrialkoxysilanes, ethyltrialkoxysilanes and propyltrialkoxysilanes.

3. The sol composition as recited in claim 1 wherein the precursor is a mixture of at least one tetraalkoxysilane and at least one trialkoxysilane.

4. The sol composition as recited in claim 1 wherein the content of the precursor is comprised between 15 to 25% by weight of the sol composition.

5. The sol composition as recited in claim 1 wherein the solvent is chosen from the group consisting of alcohols, ketones and mixtures thereof.

6. The sol composition as recited in claim 1 wherein the size of the titanium dioxide particles is comprised between 200 and 1000 nm.

7. The sol composition as recited in claim 1 wherein the titanium dioxide particles are coated with 2 to 6% of alumina by weight of $TiO_2$ particles.

8. The sol composition as recited in claim 1 wherein the silica particles are in the form of a mix of silica particles of two different size ranges: a first range between 50 and 120 nm and a second range between 3 and 25 nm.

* * * * *